May 27, 1969 J. F. BERES 3,447,094
ULTRALINEAR GAIN CONTROLLABLE AMPLIFIER
Filed March 24, 1967
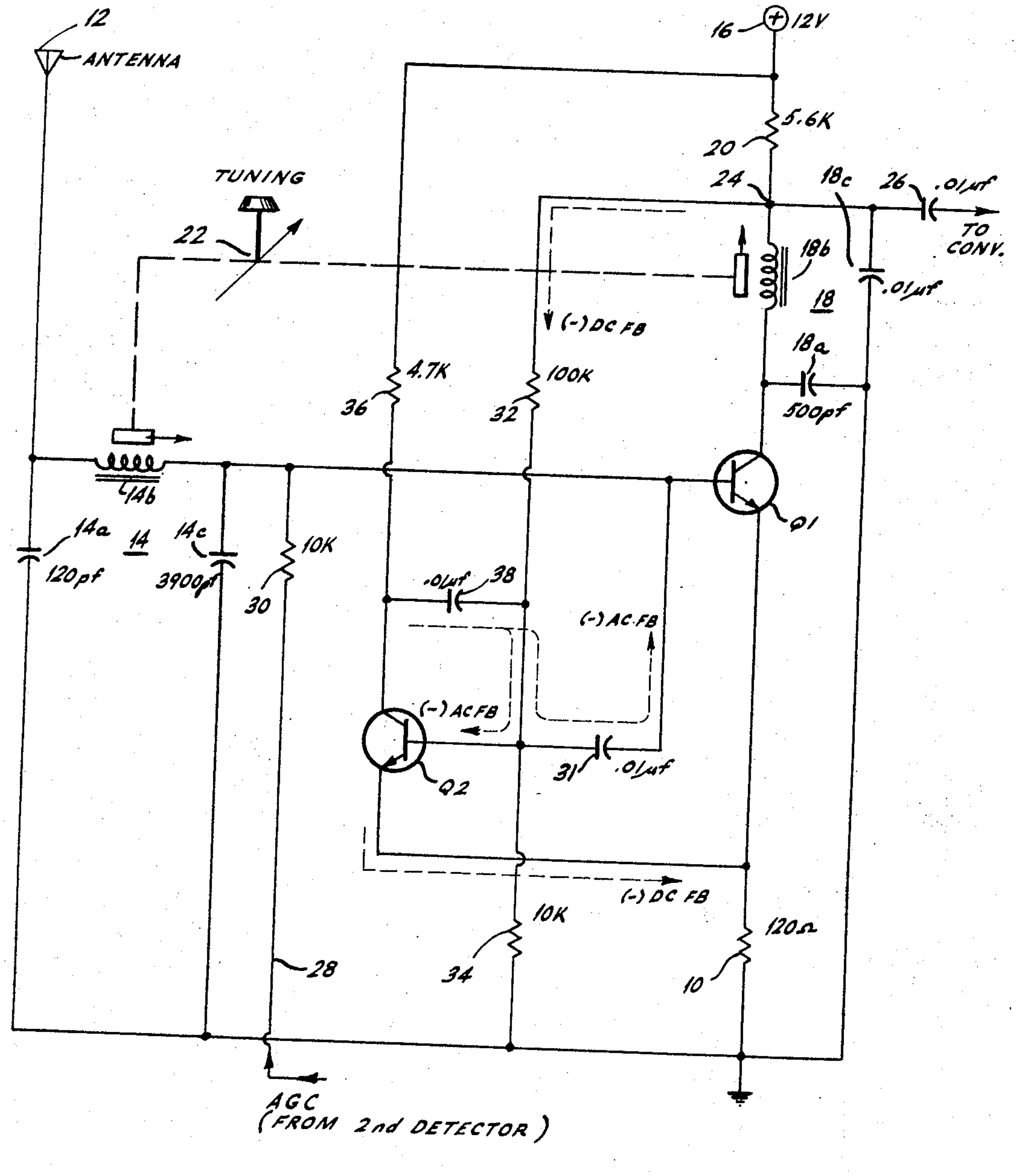
INVENTOR.
JOHN F. BERES
BY
D P Pressman
ATTORNEY

United States Patent Office 3,447,094

Patented May 27, 1969

3,447,094
ULTRALINEAR GAIN CONTROLLABLE AMPLIFIER

John F. Beres, Southampton, Pa., assignor to Philco-Ford Corporation, Philadelphia, Pa., a corporation of Delaware Filed Mar. 24, 1967, Ser. No. 625,846
Int. Cl. H03g 3/00, 3/30
U.S. Cl. 330—29 8 Claims

ABSTRACT OF THE DISCLOSURE

Gain-controlled transistor amplifying stage comprising a circuit for limiting the voltage of input signals to the amplifying stage and for accelerating reduction of its gain by an automatic gain control (AGC) voltage, thereby to eliminate cross modulation of strong input signals by such stage. As the amplitude of an input signal to the amplifying stage increases, a correspondingly increasing AGC voltage supplied to the amplifying transistor of the stage reduces the gain of said transistor and causes a direct output voltage of the stage to change. This changed direct output voltage turns on a normally cut-off control transistor. The emitters of both the amplifying and control transistors are connected to the same emitter resistor, and therefore the turn-on of the control transistor produces a voltage drop across this emitter resistor in addition to that produced by the emitter current of the amplifying transistor. This additional voltage drop further reduces the gain of the amplifying transistor. The input circuit of the control transistor, connected in shunt with that of the amplifying transistor, receives negative feedback of the input signal. As a result the input impedance of the control transistor decreases as it is turned on, thereby by-passing from the input of the amplifying transistor an increasingly large portion of the input signal.

This invention relates generally to amplifiers and particularly to a controllable gain transistor amplifier which has a linear response throughout a wide amplitude range of input signals.

In a typical receiver, an RF (radio frequency) amplifying stage may be supplied with an input signal whose amplitude varies throughout an extremely wide range, e.g., from the order of microvolts to volts, as the receiver is tuned to signals of different strength. This amplitude range will be even greater in an auto radio because the distance between such a radio and signal transmitters will vary considerably more than with a fixed or home receiver.

Although the gain of RF stages is usually controlled by an automatic gain control (AGC) signal, the extremely wide amplitude range of input signals supplied to the amplifying stage still cannot be handled adequately by present receivers. Received signals of great strength will disable (block) the receiver's local oscillator and will also drive the stage into an overload condition in which nonlinear amplification occurs. The harmonics generated by such nonlinear amplification are not particularly harmful because they can be eliminated by subsequent tuned circuits in the receiver. However the nonlinear response of an RF stage in an overload condition does produce the harmful effect of cross modulation, in which adjacent signals of a frequency close to that of the desired signal mix with the desired signal and produce resultants at the frequency of the desired signal which are audible in the output of the receiver.

The problem of cross modulation resulting from overload in an RF amplifying stage is a redoubtable one to overcome. According to present practice, cross modulation is reduced by making the input or antenna tuned circuit more selective (narrower bandwidth) in order to provide greater suppression of adjacent received signals which produce the cross modulation. However this practice increases the inherent noise generated in the receiver and thereby decreases the signal-to-noise ratio at the output of the RF stage at all signal levels. This is due mainly to the fact that the impedance match of a tuned circuit with a succeeding amplifying stage will be decreased as the selectivity of the tuned circuit is increased.

The present invention overcomes these drawbacks by providing a gain controllable amplifying circuit which is linear throughout a much wider amplitude range of input signals. Cross modulation performance is greatly improved so that the input tuned circuit can be adjusted for maximum signal to noise ratio. Additionally, the circuit has greater AGC sensitivity so that the load on the stage which supplies the AGC signal will be reduced, thereby further increasing signal-to-noise ratio. Other advantages of the present invention will become apparent from a consideration of the ensuing description thereof.

SUMMARY

According to the present invention, a gain controllable amplifier is provided with means responsive to the gain control signal for reducing the amplitude of strong input signals prior to application to the amplifier. Such means may comprise a transistor amplifier utilizing negative signal feedback whose gain is controlled by the collector current of the stage's signal amplifying transistor and whose input circuit is connected in shunt with the input signal circuit.

DESCRIPTION OF CIRCUIT

The circuit comprises a first transistor Q1 which is arranged in common emitter amplifier configuration. The emitter of Q1 is connected to ground by way of resistor 10. An input signal is supplied between ground and the base of Q1 from an antenna 12. A pi network 14, comprising a first shunt capacitor 14a, a tunable inductor 14b, and a second shunt capacitor 14c, is connected between antenna 12 and the base of Q1. The collector of Q1 is connected to a positive bias source 16 by way of a load resistor 20 and a second, similar pi network 18, consisting of two capacitors, 18a and 18c, and a tunable inductor 18b. The tuning mechanisms of inductors 14b and 18b are usually mechanically coupled (ganged) as indicated by the symbolism 22 so that both can be tuned in synchronism. The junction point 24 between pi network 18 and resistor 20 forms an output terminal of the amplifying circuit which may be coupled by a capacitor 26 to the input of the next stage, which usually is a heterodyne converter (first detector).

The gain of the amplifying circuit is controlled by an AGC signal which is supplied on an AGC bus 28 from the second detector of the receiver or any other suitable gain control signal source in well known fashion. An isolating resistor 30 is connected between bus 28 and the base of Q1. In an operational receiver, the AGC voltage was adjusted so that with no input signal, the collector current of Q1 was 1 to 2 ma. When the input signal supplied by antenna 12 increases, the AGC voltage will become larger (more negative) and will thereby decrease the forward bias on Q1 to reduce the collector current of Q1 and the gain of the circuit in well known fashion.

According to the invention a second transistor circuit including transistor Q2 is provided in association with the circuit including Q1. The base of Q2 is coupled by a capacitor 31 to the base of Q1 and is also direct current coupled to junction point 24 by resistor 32. The base of Q2 is also coupled to ground by resistor 34. The emitter of Q2 is connected to the emitter of Q1. The collector of Q2 is connected by a load resistor 36 to bias source 16 and is also capacitively coupled to the base of Q2 by a capacitor 38. Since capacitor 38 supplies negative signal feedback from the output to the input of Q2, the circuit including Q2 constitutes a Miller amplifier.

Exemplary component values or identifications for an operable circuit are indicated on the drawing.

OPERATION OF CIRCUIT

The input signal received by antenna 12 is coupled to the base of Q1 by way of pi network 14 which is tuned to suppress all signals except the one desired. This signal is amplified conventionally by the circuit including Q1 and is coupled to the input of the next stage (e.g., the converter) by way of the second pi network 18, which is also tuned to the desired signal frequency. The AGC signal supplied on lead 28 adjusts the gain of the Q1 amplifying circuit in inverse proportion to amplitude of the received signal as seen at the AGC signal source in order to decrease the magnitude of variations in the output level of the Q1 circuit as the strength of the received signal varies.

As thus far described, the circuit is conventional and suffers from the aforenoted disadvantages of having a linear response throughout a relatively narrow amplitude range of input signals. Strong input signals will drive the amplifier into a nonlinear mode of operation in which undesirable cross modulation effects will occur. These effects usually are overcome partially at the expense of signal to noise ratio by making the input tuned circuit 14 more selective. The circuit also has relatively low AGC sensitivity and thereby loads relatively greatly the subsequent stage which supplies the AGC signal, thereby further decreasing signal-to-noise ratio.

According to the invention, the amplifying circuit including Q2 is provided to control the amplitude of the input signal supplied to Q1. When weak signals are received, Q2 will be nonconductive because the AGC signal will bias Q1 on strongly enough to create a sufficiently large direct collector current in resistor 20 to lower the potential at point 24 below that required to turn on Q2. When the amplitude of the received signal is stronger, the AGC signal will become more negative, decreasing the collector current of Q1 and raising the potential at point 24 so as to turn on Q2; the degree of conduction of Q2 will be proportional to signal strength. Conduction of Q2 in response to strong input signals will produce the following beneficial effects:

(1) As Q2 is biased on more strongly when the amplitude of the input signal increases, Q2 will amplify a portion of the input signal it receives at its base via capacitor 31. An amplified and inverted version of the input signal will appear at the collector of Q2 where it will be fed back, via capacitor 38, to the bases of Q1 and Q2. By reason of the negative signal feedback (—AC FB) from the output to the input of Q2, the capacitive load in shunt with the input circuit of Q1 will be magnified (Miller effect). The magnitude of this capacitive load will increase as the amplitude of the input signal increases. The circuit including Q2 thereby will cause a portion of the input signal supplied to Q1 to be shunted from the base of Q1 to ground so as to reduce or limit the input signal supplied to Q1. Thus Q1 will not be overdriven by strong input signals and the undesirable production of cross modulation effects will be reduced. Therefore the design of the input tuned circuit 14 can be adjusted for maximum signal-to-noise ratio to effect an improvement in noise performance of the receiver.

(2) Conduction of Q2 will also allow current to flow from source 16, through resistor 36, the collector-emitter circuit of Q2, and resistor 10 to ground. This will raise the emitter potential of Q1, thereby reducing the forward bias on Q1 and adding to the reverse biasing effect of the AGC signal. Q2 can therefore be regarded as supplying negative direct current feedback (—DC FB) to Q1 since, as the amplitude of the input signal increases, the forward bias on Q1 will be reduced by the action of Q2. Q2 thereby reduces the AGC current requirement and increases the AGC sensitivity of the amplifying stage including Q1. This reduces the load on the AGC signal supply stage making more signal available at the output of the receiver and thereby increasing signal-to-noise ratio.

The following are quantitative comparisons which have been made between a circuit according to the invention and one without the invention at those frequencies where performance for the respective qualities is most critical.

*Signal-to-noise ratio.*—In a receiver without the circuit of the invention the volume control was adjusted so that with an 11 $\mu$v., 600 kHz. input carrier signal which was 30% amplitude modulated with a 1 kHz. modulating signal, 1 watt of power was supplied to an output load. Without the input signal the measured noise in the load was 20 to 35 mw., which is 17–15 db below the 1 watt level. With the circuit of the invention it was possible to readjust the input tuned circuit so that the measured noise in the same test was reduced to 3 to 6 mw. and the signal-to-noise ratio was increased to 22–25 db.

*Cross modulation.*—Without the invention the volume control was adjusted so that with an 11 $\mu$v., 1400 kHz. input carrier signal which was 30% amplitude modulated at 1 kHz., 1 watt was supplied to an output load. The modulation was then removed from the 1400 kHz. signal and a similarly modulated 1440 kHz. signal was also supplied at the input; the measured cross modulation in the load was 0.1 to 2.0 mw. (38 to 27 db below 1 watt). With the circuit of the invention the input tuned circuit was able to be readjusted so that the cross modulation in the same test was reduced an average of about 0.6 mw., or about 3 db.

*Oscillator blocking.*—Without the invention it was found that with the AGC signal disabled, the local oscillator would be blocked by a 200–500 mv. signal at 600 kHz. and a 1.0 v. signal amplitude at 1 MHz. With the invention the blocking voltage was increased to 2.0 v. at 600 kHz.

The circuit of the invention is not limited to use as an RF amplifier in a radio receiver but can be used in any application where a controllable gain amplifier is desired. Also the emitter of Q2 may be connected to ground rather than to the emitter of Q1 if increased AGC sensitivity is unimportant. PNP transistors can be used in lieu of the NPN transistors shown if the polarity of the bias supply is reversed.

While there has been described what is at present considered to be the preferred embodiment of the invention it will be apparent that various modification and other embodiments thereof will occur to those skilled in the art within the scope of the invention.

I claim:

1. A gain-controlled amplifying circuit, comprising:

(a) an amplifying stage comprising an amplifying transistor and a source of bias potential, means connecting the collector of said transistor to one terminal of said source, a resistor connecting the emitter of said transistor to the other terminal of said source, (b) a source of an alternating current input signal and means for supplying said input signal to the base-emitter circuit of said amplifying transistor to vary the base-to-emitter alternating current potential of said amplifying transistor, (c) a source of a direct current gain control signal and means for supplying said signal to the base of said amplifying transistor so as to vary the base-to-emitter direct current potential of said amplifying transistor so that the collector voltage and gain of said amplifying transistor will change as a function of said gain control voltage, (d) a control transistor, the emitter thereof being connected to junction between the emitter of said amplifying transistor and said resistor, the collector of said control transistor being connected to said one terminal of said source of bias potential, (e) means connected between the collector of said amplifying transistor and the base of said control transistor for increasing the base-emitter direct current potential of said control transistor, in a direction which increases the gain and collector-emitter current of said control transistor, in response to a change in the direct current collector voltage of said amplifying transistor resulting from a decrease in gain of said amplifying stage in response to said gain control voltage, whereby the decrease in gain of said amplifier will be accelerated by a change in emitter potential of said amplifying transistor in response to said increase in collector-emitter current of said control transistor.

2. The circuit of claim 1 wherein said input signal source is also connected to vary the base-to-emitter potential of said control transistor, and further including a capacitor connected between the collector and the base-emitter circuit of said control transistor so as to supply negative signal feedback between said collector and said base-emitter circuit, whereby said negative signal feedback will cause the input impedance of said control transistor to decrease when said control transistor is turned on, so that as said input signal increases in amplitude, a greater proportion thereof will be shunted from said amplifying transistor.

3. The circuit of claim 1 wherein the amplitude of said gain control voltage is proportional to the average amplitude of said input signal, for at least a given average amplitude range of said input signal.

4. The circuit of claim 2 wherein the base of said control transistor is connected to the base of said amplifying transistor by a second capacitor and to said other terminal of said bias source and to the collector of said amplifying transistor, respectively, by second and third resistors.

5. A gain-controlled amplifying circuit, comprising:

(a) an amplifying stage comprising an amplifying transistor and a source of bias potential, means connecting the collector of said transistor to one terminal of said source, a resistor connecting the emitter of said transistor to the other terminal of said source, (b) a source of an alternating current input signal and means for supplying said input signal to the base-emitter circuit of said amplifying transistor so as to vary the base-to-emitter alternating current potential of said amplifying transistor, (c) a source of a direct current gain control signal and means for supplying said signal to the base of said amplifying transistor so as to vary the base-to-emitter direct current potential of said ampliyfying transistor so that the collector voltage and gain of said amplifying transistor will change as a function of said gain control voltage, (d) a control transistor, the emitter thereof being connected to the other terminal of said source of bias potential, means connecting the collector thereof to said one terminal of said source, (e) means for suppliyng said alternating current input signal to the base-emitter circuit of said control transistor so as to vary the base-to-emitter alternating current potential of said control transistor and for preventing direct current flow from the base of said amplifying transistor to the base of said control transistor, (f) a capacitor connected between the collector and the base-emitter circuit of said control transistor for supplying negative signal feedback from said collector to said base-emitter circuit, and (g) means for maintaining said control transistor nonconductive in absence of said gain control voltage and for turning on said control transistor in response to the reduction of gain of said amplifying transistor by said gain control voltage, whereby said negative signal feedback will cause the input impedance of said control transistor to decrease when said control transistor is turned on so that as said input signal increases, a greater proportion thereof will be shunted from said amplifying transistor.

6. The circuit of claim 5 wherein emitter of said control transistor is directly connected to the junction between the emitter of said amplifying transistor and said resistor, and further including means connected between the collector of said amplifying transistor and the base-emitter circuit of said control transistor for increasing the base-emitter direct current potential of said control transistor in a direction which increases the gain and collector-emitter current of said control transistor in response to a change in the direct current collector voltage of said amplifying transistor resulting from a decrease in gain of said amplifying stage in response to said gain control voltage, whereby the decrease in gain of said amplifying stage will be accelerated by a change in emitter potential of said amplifying transistor in response to said increase in collector-emitter current of said control transistor.

7. The circuit of claim 6 wherein the amplitude of said gain control voltage is proportional to the average amplitude of said input signal, for at least a given average amplitude range of said input signal.

8. The circuit of claim 5 wherein the base of said control transistor is connected to the base of said amplifying transistor by a second capacitor and to said other terminal of said bias source and to the collector of said amplifying transistor, respectively, by second and third resistors.

References Cited

UNITED STATES PATENTS

| | | | |
|---|---|---|---|
| 2,774,866 | 12/1956 | Burger | 330—29 X |
| 3,036,275 | 5/1962 | Harmer | 330—29 |
| 3,368,156 | 2/1968 | Kam | 330—29 X |

FOREIGN PATENTS

| | | |
|---|---|---|
| 952,904 | 3/1964 | Great Britain. |

ROY LAKE, *Primary Examiner.*

J. B. MULLINS, *Assistant Examiner.*

U.S. Cl. X.R.

330—139, 142